US008159221B2

(12) United States Patent
Yui

(10) Patent No.: US 8,159,221 B2
(45) Date of Patent: Apr. 17, 2012

(54) MAGNETIC RESONANCE IMAGING APPARATUS AND METHOD USING SSFP HAVING NON-ZERO FIRST MOMENT GRADIENTS WITHIN THE REPETITION TIME

(75) Inventor: Masao Yui, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 485 days.

(21) Appl. No.: 12/273,718

(22) Filed: Nov. 19, 2008

(65) Prior Publication Data

US 2009/0134871 A1  May 28, 2009

(30) Foreign Application Priority Data

Nov. 22, 2007 (JP) ................................. 2007-303555
Oct. 8, 2008 (JP) ................................. 2008-261419

(51) Int. Cl.
*G01V 3/00* (2006.01)
(52) U.S. Cl. ........................................ 324/307; 309/318
(58) Field of Classification Search .......... 324/300–322; 600/407–435; 365/152
See application file for complete search history.

(56) References Cited

U.S. PATENT DOCUMENTS

| | | | | | |
|---|---|---|---|---|---|
| 2,718,629 | A | * | 9/1955 | Anderson et al. | 365/152 |
| 3,515,981 | A | * | 6/1970 | Tong et al. | 324/310 |
| 4,769,603 | A | | 9/1988 | Oppelt et al. | 324/309 |
| 4,973,906 | A | * | 11/1990 | Bernstein | 324/309 |
| 6,434,412 | B1 | | 8/2002 | Simonetti et al. | 600/410 |
| 6,806,709 | B2 | * | 10/2004 | Markl et al. | 324/307 |
| 6,856,132 | B2 | * | 2/2005 | Appel et al. | 324/303 |
| 7,558,612 | B2 | * | 7/2009 | Meyer | 600/410 |
| 7,957,788 | B2 | * | 6/2011 | Judd et al. | 324/309 |
| 2003/0193337 | A1 | * | 10/2003 | Meyer | 324/309 |
| 2004/0090230 | A1 | * | 5/2004 | Appel et al. | 324/307 |
| 2004/0113613 | A1 | * | 6/2004 | Markl et al. | 324/307 |
| 2006/0184007 | A1 | * | 8/2006 | Judd et al. | 600/419 |
| 2009/0134871 | A1 | * | 5/2009 | Yui | 324/309 |
| 2009/0160440 | A1 | * | 6/2009 | Yui | 324/307 |
| 2010/0109665 | A1 | * | 5/2010 | Nielsen et al. | 324/309 |
| 2010/0160767 | A1 | * | 6/2010 | Deimling | 600/419 |
| 2011/0101979 | A1 | * | 5/2011 | Wiesinger et al. | 324/309 |

OTHER PUBLICATIONS

Overall W. R., et al., "Oscillating Dual-Equilibrium Steady-State Angiography," Magnetic Resonance in Medicine, Academic Press, Duluth, MN, US, vol. 47, No. 3, Mar. 1, 2002, pp. 513-522, XP001172467, ISSN: 0740-3194.
Foo T. K., et al., "MR Angiography using Steady State Free Precession," International Society for Magnetic Resonance in Medicine, Scientific Meeting and Exhibition, Proceedings, International Society for Magnetic Resonance in Medicine, US, Apr. 21, 2001, p. 1950, XP002286044, ISSN: 1524-6965.

* cited by examiner

*Primary Examiner* — Brij B Shrivastav
*Assistant Examiner* — Tiffany Fetzner
(74) *Attorney, Agent, or Firm* — Nixon & Vanderhye PC

(57) ABSTRACT

A magnetic resonance imaging apparatus includes a data acquisition unit and an image generating unit. The data acquisition unit acquires MR data according to an imaging condition for obtaining a SSFP in flowing matter by applying excitation pulses having a same flip angle with a constant TR and gradient magnetic fields to an object. The image generating unit generates an image of the flowing matter based on the MR data.

21 Claims, 8 Drawing Sheets

MAGNETIC RESONANCE IMAGING APPARATUS AND METHOD USING SSFP HAVING NON-ZERO FIRST MOMENT GRADIENTS WITHIN THE REPETITION TIME

This application claims priority to Japanese Application No(s). 2007-303555, filed 22 Nov. 2007 and 2008-261419, filed 08 Oct. 2008 entire contents of each of which are hereby incorporated by reference.

BACKGROUND OF THE INVENTION

1. Field of the Invention

The present invention relates to an MRI (magnetic resonance imaging) apparatus and a magnetic resonance imaging method which excite nuclear spins of an object magnetically with an RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which acquire an MR (magnetic resonance) image of flowing matter by using SSFP (Steady State Free Precession).

2. Description of the Related Art

Magnetic Resonance Imaging is an imaging method which magnetically excites nuclear spins of an object set in a static magnetic field with a Larmor frequency RF signal and reconstructs an image based on NMR signals generated due to the excitation.

In the field of magnetic resonance imaging, the imaging method using SSFP (Steady State Free Precession) has been known. As a typical example of a high-speed imaging sequence using SSFP, there is a sequence referred to as True-FISP (fast imaging with steady precession) (see, for example, U.S. Pat. No. 4,769,603).

FIG. 1 is a flowchart showing a conventional TrueFISP sequence.

As shown in FIG. 1, the conventional SSFP sequence such as the TrueFISP sequence applies an RF excitation pulse repeatedly at a constant and short TR (repetition time) with a same excitation angle (flip angle) α to lead magnetization in a steady state quickly. The gradient magnetic field is adjusted so that the zero-order moment (time integration) becomes zero. The gradient magnetic field in a read out axis direction is controlled so that the polarity inverts several times. As a result, an obtained echo signal has a high signal to noise ratio (SNR) and a signal intensity S depends on a relaxation time of a tissue as shown in the expression (1).

$$S \propto 1/(1+T1/T2) \tag{1}$$

Note that, the expression (1) is a relational expression when an excitation angle α is 90 degrees. T1 and T2 are a longitudinal relaxation time of a tissue and a transverse relaxation time of a tissue respectively. As shown in the expression (1), the intensity S of signal obtained by the SSFP sequence depends on a relaxation time ratio T1/T2 of a tissue. Consequently, it is known that it is the most effective from the contrast viewpoint to regard a cine image of a heart as an applicable target of the SSFP sequence. In addition, the effectiveness of the SSFP sequence to imaging of the abdominal vasculature has been pointed out. Since blood vessels can be imaged without contrast medium by using the SSFP sequence, the SSFP sequence is receiving attention in the field of imaging of vessels.

In the meanwhile, the requirements needed for the SSFP sequence include requirements with regard to a phase of RF pulse in addition to the requirement that the zero-order moment of gradient magnetic field becomes zero as described above. The simplest control requirement with regard to a phase of RF pulse is that a phase of continuous RF pulse alternates between zero degree and 180 degrees (π radian).

FIG. 2 is a diagram showing a variation of magnetization intensity by a scan under the conventional SSFP sequence.

When the nutation angle is controlled so that each excitation angle of continuous RF pulses becomes α, and phase is controlled so that the phase of a continuous RF pulse alternates between zero and 180 degrees, the magnetization state alternates between the state (A) and the state (B) as shown in a vectorial representation in FIG. 2.

That is, phases of excitation pulses are controlled so that:
the excitation angle becomes α, α, α, ...,
the phase of excitation pulse becomes 0°, 180°, 0°, ..., and
the state of magnetization becomes (A), (B), (A), ....

As shown in FIG. 2, a magnetization that reached a steady state becomes the state (A) that deviates from the static magnetic field direction by α/2. In this state (A) of magnetization, when an excitation pulse changing the phase by 180 degrees is applied, the magnetization state changes from the state (A) to the state (B). Moreover, in the magnetization state (B), when an excitation pulse changing the phase by 180 degrees is applied, the magnetization state returns from the state (B) to the state (A) again.

In this way, it turns out that a steady state is maintained effectively by changing the phase of continuous wave RF excitation pulses by 180 degrees. It is also known that the time required for transferring magnetization in thermal equilibrium to a steady state can be reduced by the foregoing phase control of an excitation pulse.

The SSFP sequence is also applied to imaging of a part where flowing matter such as blood flow exists but special consideration is made when flowing matter exists in an imaging area. That is, as shown in the expressions (2-1) and (2-2), a gradient magnetic field is controlled so that not only does a zero-order moment of the gradient magnetic field become zero, but a first-order moment of the gradient magnetic field becomes zero in order to prevent magnetization of matter flowing in the gradient magnetic field direction from a phase shift.

$$\int G\,dt = 0 \tag{2-1}$$

$$\int Gt\,dt = 0 \tag{2-2}$$

wherein G denotes the intensity of the gradient magnetic field and t denotes time.

FIG. 3 is a diagram explaining the conventionally known phase shift.

FIG. 3(a) shows a gradient magnetic field to be applied. FIG. 3(b) shows a time variation of phase of magnetization in matter flowing in the direction in which the gradient magnetic field shown in FIG. 3(a) is applied.

The phase of magnetization of matter flowing in the gradient magnetic field direction changes due to the gradient magnetic field applied as shown in FIG. 3, and undergoes what is called a phase shift. For this reason, it is obvious that the steady state as shown in FIG. 2 is not maintained.

Consequently, in the conventional SSFP sequence, the gradient magnetic field is determined so as to avoid the foregoing phase shift and maintain a steady state.

FIG. 4 is a diagram showing a relationship between a gradient magnetic field applied by the conventional SSFP sequence and a phase of magnetization of matter flowing in the gradient magnetic field direction.

FIG. 4(a) shows a gradient magnetic field applied by a conventional SSFP sequence. FIG. 4(b) shows a time variation of phase of magnetization in matter flowing in the direction in which the gradient magnetic field shown in FIG. 4(a) is applied.

As shown in FIG. 4(a), when the gradient magnetic field is applied so that the zero-order and the first-order moments become zero, a magnetization of matter flowing in an application direction of the gradient magnetic field undergoes a phase shift as shown in FIG. 4(b). However, since the first-order moment of the applied gradient magnetic field is zero, the phase shift is offset as shown in FIG. 4(b) and the phase shift does not eventually occur in the magnetization of the flowing matter.

As described above, although both of the zero-order moments of the gradient magnetic field shown in FIG. 3 and FIG. 4 are zero, it turns out that a phase shift does not occur when the gradient magnetic field as shown in FIG. 4 is applied while a phase shift occurs when the gradient magnetic field as shown in FIG. 3 is applied. In other words, in the conventional SSFP sequence as described above, both the zero-order and the first-order moments of the gradient magnetic field need to be zero to avoid a phase shift in flowing matter.

For this reason, the conventional SSFP sequence is carefully assembled so as to satisfy the foregoing various conditions in order to avoid a phase shift in magnetization of flowing matter. As a result, magnetization of flowing matter such as blood flow can be imaged with a satisfactory SNR as well as magnetization of a static matter such as an organ.

However, an image obtained by imaging under the conventional SSFP sequence becomes an image where flowing matter such as blood flow overlaps with organs. For this reason, there is a problem that it might become difficult to distinguish blood flow and vessels from organs in case of focusing on only the blood flow and the vessels since the flowing matter and the organs coexist.

In addition, in the conventional SSFP sequence, there is a problem that a steady state of magnetization of flowing matter might not be maintained well when the control of the gradient magnetic field is inadequate although magnetization of a static matter such as an organ maintains a steady state effectively.

Therefore, a technique for imaging only a vessel and flowing matter such as blood flow by using the SSFP is required.

SUMMARY OF THE INVENTION

The present invention has been made in light of the conventional situations, and it is an object of the present invention to provide a magnetic resonance imaging apparatus and a magnetic resonance imaging method which make it possible to acquire a MR image of flowing matter by use of a SSFP.

The present invention provides a magnetic resonance imaging apparatus comprising: a data acquisition unit configured to acquire magnetic resonance data according to an imaging condition for obtaining a steady state free precession of nuclear magnetic spins in flowing matter in an object by applying plural excitation pulses having a same flip angle with a constant repetition time and gradient magnetic fields to the object; and an image generating unit configured to generate an image of the flowing matter based on the magnetic resonance data, wherein respective zero order moments of gradient magnetic field within the repetition time, gradient magnetic field for slice selection from each application time of the plural excitation pulses till a center time of a corresponding echo, gradient magnetic field for readout from each application time of the plural excitation pulses till a center time of a corresponding echo, gradient magnetic field for slice selection from a center time of each echo till an application time of a following excitation pulse, gradient magnetic field for readout from a center time of each echo till an application time of a following excitation pulse are zero while a first order moment of at least one of gradient magnetic field for slice selection and gradient magnetic field for readout within the repetition time is nonzero, in an aspect to achieve the object.

The present invention also provides a magnetic resonance imaging apparatus comprising: a pre-scan unit configured to acquire pieces of magnetic resonance data corresponding to mutually different plural differences in transmission phases between adjacent excitation pulses by performing a pre-scan with changing a difference in the transmission phases between the adjacent excitation pulses of an imaging condition for obtaining a steady state free precession of nuclear magnetic spins in flowing matter in an object by applying plural excitation pulses having a same flip angle with a constant repetition time and gradient magnetic fields to the object; and an image generating unit configured to generate plural pre-scan images of the flowing matter based on the pieces of the magnetic resonance data, wherein respective zero order moments of gradient magnetic field within the repetition time, gradient magnetic field for slice selection from each application time of the plural excitation pulses till a center time of a corresponding echo, gradient magnetic field for readout from each application time of the plural excitation pulses till a center time of a corresponding echo, gradient magnetic field for slice selection from a center time of each echo till an application time of a following excitation pulse, gradient magnetic field for readout from a center time of each echo till an application time of a following excitation pulse are zero while a first order moment of at least one of gradient magnetic field for slice selection and gradient magnetic field for readout within the repetition time is nonzero, in an aspect to achieve the object.

The present invention also provides a magnetic resonance imaging method comprising: acquiring magnetic resonance data according to an imaging condition for obtaining a steady state free precession of nuclear magnetic spins in flowing matter in an object by applying plural excitation pulses having a same flip angle with a constant repetition time and gradient magnetic fields to the object; and generating an image of the flowing matter based on the magnetic resonance data, wherein respective zero order moments of gradient magnetic field within the repetition time, gradient magnetic field for slice selection from each application time of the plural excitation pulses till a center time of a corresponding echo, gradient magnetic field for readout from each application time of the plural excitation pulses till a center time of a corresponding echo, gradient magnetic field for slice selection from a center time of each echo till an application time of a following excitation pulse, gradient magnetic field for readout from a center time of each echo till an application time of a following excitation pulse are zero while a first order moment of at least one of gradient magnetic field for slice selection and gradient magnetic field for readout within the repetition time is nonzero, in an aspect to achieve the object.

The magnetic resonance imaging apparatus and the magnetic resonance imaging method as described above make it possible to acquire a MR image of flowing matter by use of a SSFP.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
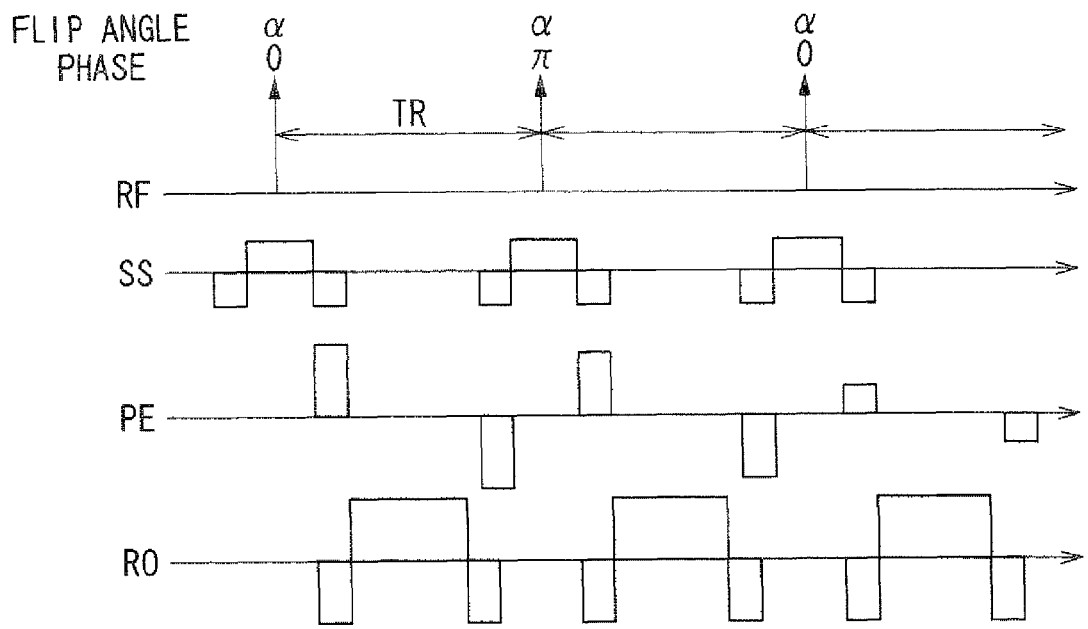
FIG. 1 is a flowchart showing the conventional TrueFISP sequence.
Figure 2:
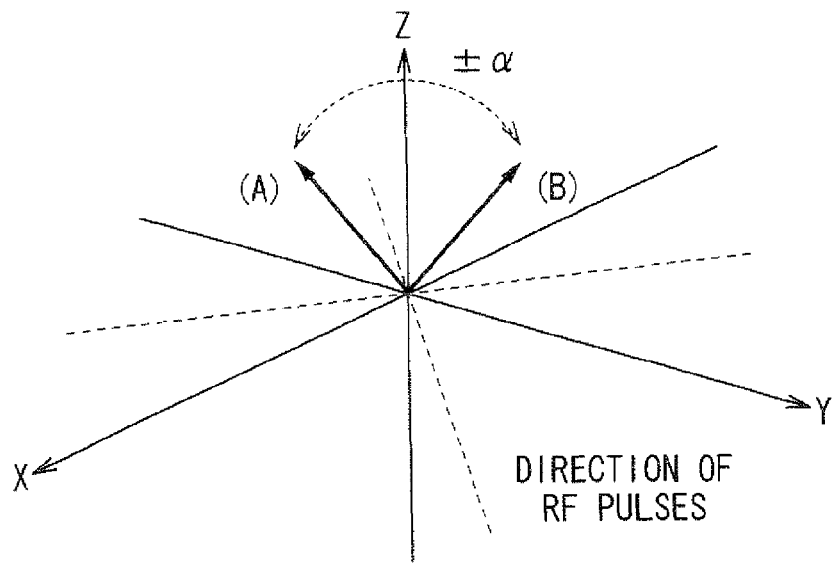
FIG. 2 is a diagram showing a variation of magnetization intensity by a scan under the conventional SSFP sequence.
Figure 3:
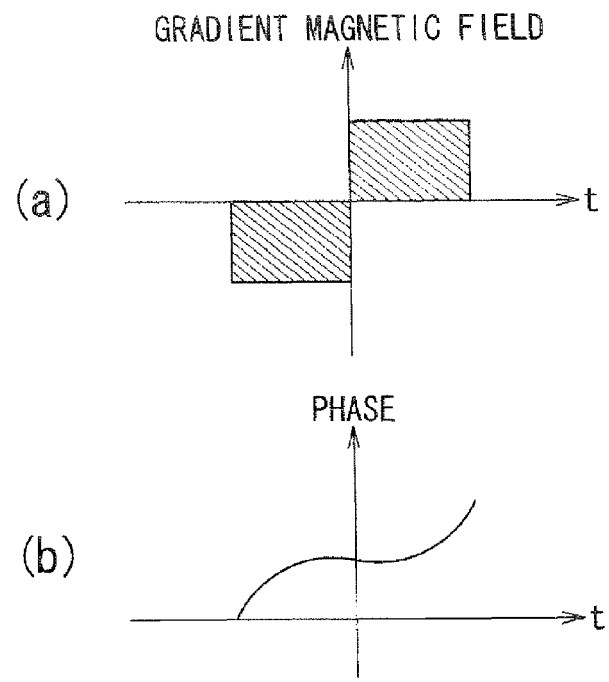
FIG. 3 is a diagram explaining the conventionally known phase shift.
Figure 4:
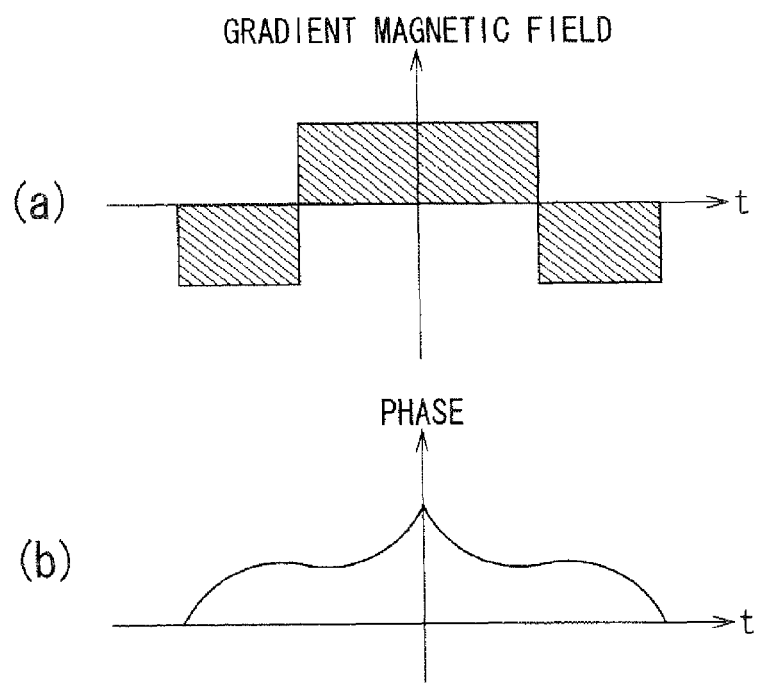
FIG. 4 is a diagram showing a relationship between a gradient magnetic field applied by the conventional SSFP sequence and a phase of magnetization of matter flowing in the gradient magnetic field direction.
Figure 5:
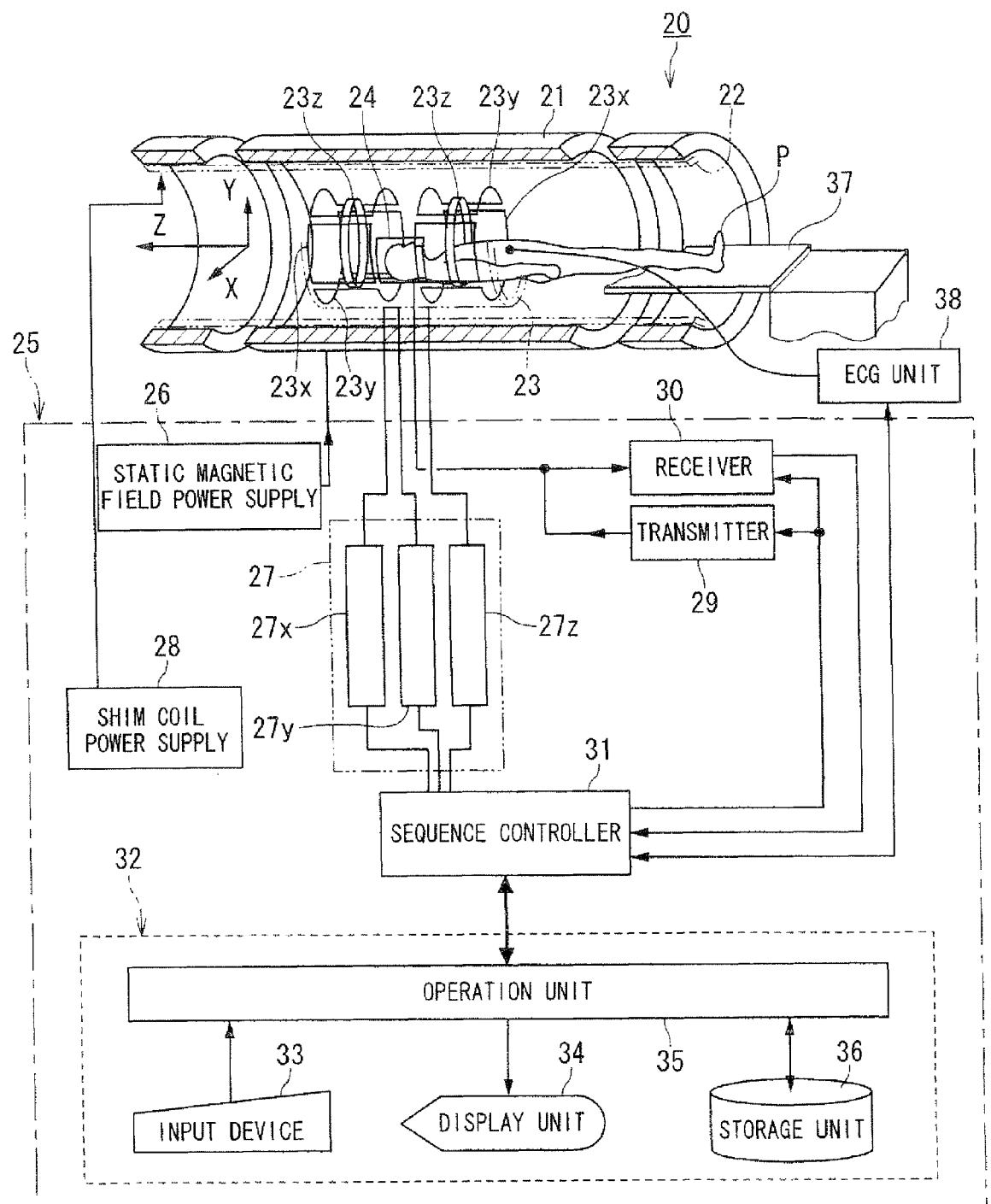
FIG. 5 is a block diagram showing a magnetic resonance imaging apparatus according to an embodiment of the present invention.

FIG. 5 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and an RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control/system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit an RF signal given from the transmitter 29 to the object P and receive an MR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and an RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give an RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG unit 38 for acquiring an ECG (electrocardiogram) signal of the object P is provided with the magnetic resonance imaging apparatus 20. The ECG signal detected by the ECG unit 38 is outputted to the computer 32 through the sequence controller 31.

Note that, a PPG (peripheral pulse gating) signal may be acquired instead of an ECG signal. A PPG signal is acquired by detecting a pulse wave of e.g. tip of a finger as an optical signal. When a PPG signal is acquired, a PPG signal detection unit is provided with the magnetic resonance imaging apparatus 20.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

Figure 6:
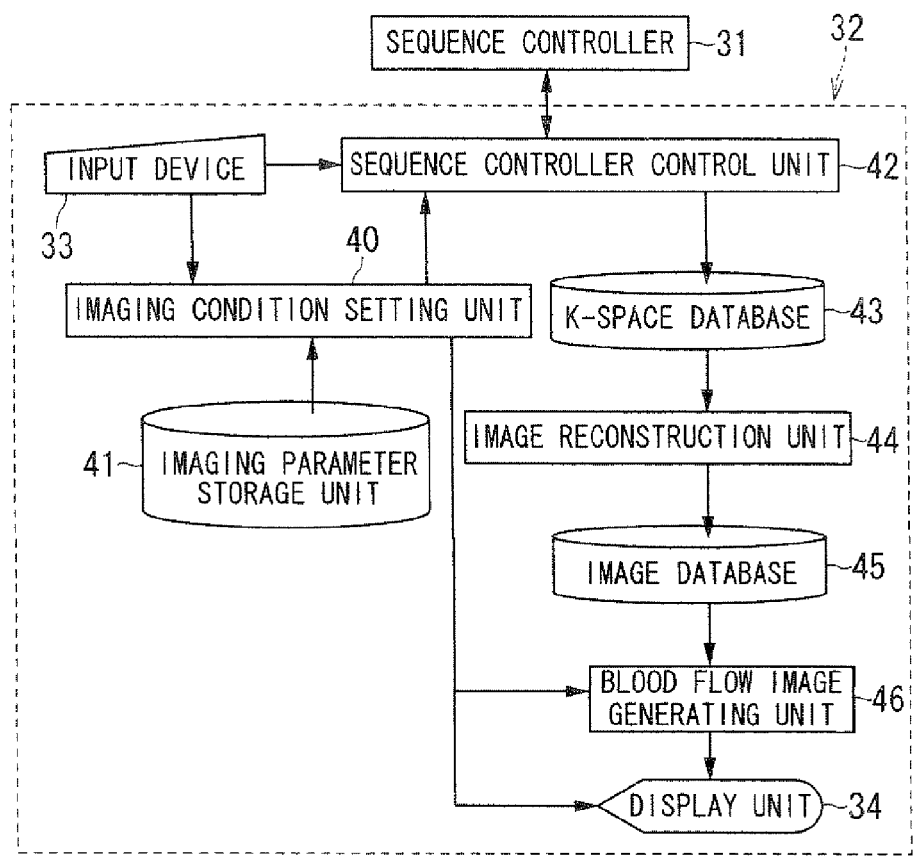
FIG. 6 is a functional block diagram of the computer shown in FIG. 5.

FIG. 6 is a functional block diagram of the computer 32 shown in FIG. 5.

The computer 32 functions as an imaging condition setting unit 40, an imaging parameter storage unit 41, a sequence controller control unit 42, a k-space database 43, an image reconstruction unit 44, an image database 45 and a blood flow image generating unit 46 by program.

The imaging condition setting unit 40 has a function for setting an imaging condition by which signals from a static matter such as an organ by using a SSFP sequence are suppressed and signals from flowing matter such as blood flow are enhanced and acquired, and providing the imaging condition including the set pulse sequence to the sequence controller control unit 42. Setting of an imaging condition can be performed based on instruction information from the input device 33.

For this purpose, the imaging condition setting unit 40 has a function to display a setting screen of an imaging condition on the display unit 34. Thus, a user can select an imaging protocol used for imaging from plural imaging protocols, corresponding to respective imaging parts and/or respective imaging conditions, prepared in advance and set an imaging condition including necessary parameter values by performing an operation on the input device 33 with reference to the setting screen displayed on the display unit 34.

Further, the imaging condition setting unit 40 is configured to set whether to automatically perform image processing such as subtraction processing and/or MIP (Maximum Intensity Projection) processing for generating and displaying a blood flow image, after data acquisition, through the setting screen. Therefore, the imaging condition setting unit 40 is configured to provide the instruction to automatically perform image processing to the blood flow image generating unit 46 when instruction information to automatically perform image processing is input from the input device 33.

Here, an imaging condition for a flowing matter using a SSFP sequence will be described. Hereinafter, a case where a flowing matter is blood flow will be described mainly, but the same holds true for a flowing matter, such as lymph, CSF (cerebrospinal fluid) and fluid flowing in a gastrointestinal tract, other than blood flow.

Figure 7:
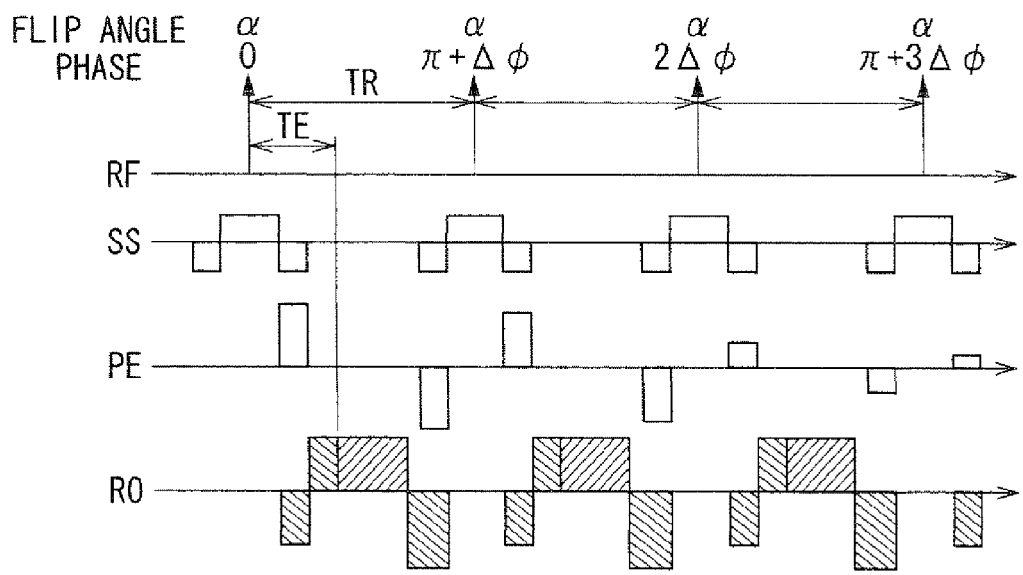
FIG. 7 is a diagram showing an example of SSFP sequence, for generating a blood flow image, set by the imaging condition setting unit shown in FIG. 5.

FIG. 7 is a diagram showing an example of SSFP sequence, for generating a blood flow image, set by the imaging condition setting unit 40 shown in FIG. 5.

In FIG. 7, RF denotes RF excitation pulses, SS denotes gradient magnetic field for slice selection in a slice axis direction, PE denotes gradient magnetic field for phase encode in a phase encode axis direction and RO denotes gradient magnetic field for readout in a readout axis direction.

As shown in FIG. 7, an SSFP sequence for generating a blood flow image applies an RF excitation pulse repeatedly with a same excitation angle (flip angle) α with a constant and short TR so as to lead a magnetization to a steady state quickly. The gradient magnetic fields in triaxial directions of a slice axis, a phase encode axis and a readout axis are controlled so that zero-order moment in each direction becomes zero between TRs. Moreover, the gradient magnetic fields in the readout axis direction and the slice axis direction is controlled so that zero-order moment becomes zero not only within an echo time (TE) between an application center time of an RF excitation pulse and a center time of an echo, but also within an interval between a center time of an echo and an application center time of the subsequent RF excitation pulse.

Moreover, in a SSFP sequence for generating a blood flow image, each gradient magnetic field is controlled so that a first-order moment of gradient magnetic field in at least one of a readout axis direction and a slice axis direction has a nonzero value within a TR.

Note that, FIG. 7 shows an example that a first-order moment of gradient magnetic field in a readout axis direction is controlled so as to become a nonzero value. Hereinafter, a case where a first-order moment of gradient magnetic field in a readout axis direction is controlled to be a nonzero value will be described.

In this case, a zero-order moment M0 and a first-order moment M1 of gradient magnetic field in a readout axis direction in a TR are required to fulfill the expressions (3-1)

and (3-2) when an intensity of the gradient magnetic field in the readout axis direction is expressed by G.

$$M0 = \int G dt = 0 \quad (3\text{-}1)$$

$$M1 = \int G t dt \neq 0 \quad (3\text{-}2)$$

As shown in the expression (3-2) and FIG. 7, when the first-order moment M1 of the gradient magnetic field in the readout axis direction is controlled to be a nonzero value, a transverse magnetization of blood flow moving at a constant velocity v in the read out axis direction undergoes a phase shift of γ×M1×v wherein γ denotes a gyromagnetic ratio, due to the gradient magnetic field in the read out axis direction. For this reason, a difference occurs in signal intensity between a signal obtained from the blood flow and a signal from a static organ, and therefore, a blood flow image with a contrast in which the signal from the blood flow is selectively enhanced can be obtained.

Here, as shown in FIG. 7, it is preferable to control each phase angle of RF excitation pulses so that a difference between transmission phase angles of adjacent RF excitation pulses becomes a value different from an odd number times π (180°). That is, when a transmission phase angle of the n-th applied RF excitation pulse is denoted by φ(n), it is preferable to control each phase angle of the RF excitation pulses so that the conditions shown in the expressions (4-1) and (4-2) are satisfied.

$$\phi(n+1) - \phi(n) = \pi + \Delta\phi \text{ [radian]} \quad (4\text{-}1)$$

$$\Delta\phi \neq 2\pi m \text{ (m is an integer)} \quad (4\text{-}2)$$

Here, the effect of the foregoing control of each phase angle of the RF excitation pulses will be described with reference to the drawings.

Figure 8:
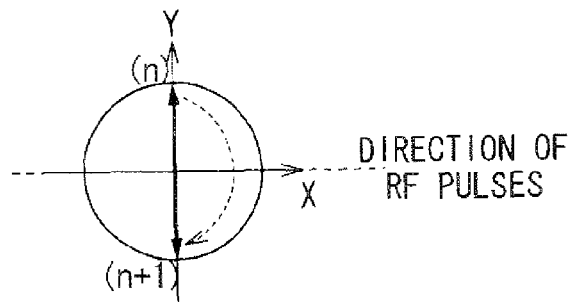
FIG. 8 is a diagram showing a variation of transverse magnetization in a static matter in case of setting a difference in phase angles between adjacent RF excitation pulses to an odd number times $\pi$ in the SSFP sequence shown in FIG. 7.
Figure 9:
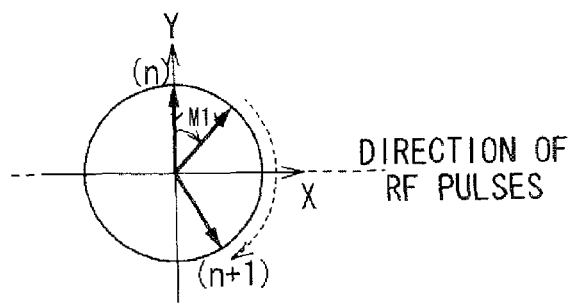
FIG. 9 is a diagram showing a variation of transverse magnetization in a flowing matter in case of setting a difference in phase angles between adjacent RF excitation pulses to an odd number times $\pi$ in the SSFP sequence shown in FIG. 7.

FIG. 8 is a diagram showing a variation of transverse magnetization in a static matter in case of setting a difference in phase angles between adjacent RF excitation pulses to an odd number times π in the SSFP sequence shown in FIG. 7. FIG. 9 is a diagram showing a variation of transverse magnetization in a flowing matter in case of setting a difference in phase angles between adjacent RF excitation pulses to an odd number times π in the SSFP sequence shown in FIG. 7.

Each of FIGS. 8 and 9 is a diagram showing a magnetization in XY directions in a system rotating, with regard to a laboratory system, with the same frequency as the center frequency of the magnetization, as viewed from the static magnetic field direction.

In the SSFP sequence shown in FIG. 7, when a difference π+Δφ in phase angle between adjacent RF excitation pulses is controlled to become an odd number times π, that is, so that Δφ=2πm in the expression (4-1), transverse magnetizations of a static matter such as an organ and flowing matter such as blood flow presents behaviors as shown in FIG. 8 and FIG. 9 respectively.

Specifically, when a transverse magnetization of a static matter turns to the (n) position shown in FIG. 8 by application of the n-th RF excitation pulse, the transverse magnetization of the static matter inverts to the (n+1) position by application of the (n+1)-th RF excitation pulse. Therefore, the transverse magnetization becomes the same in size before and after excitation. As described above, as for the static matter, a steady state of the magnetization can be maintained well.

In contrast, when a transverse magnetization of flowing matter such as blood flow moving with a constant velocity v in the read out axis direction turns to the (n) position shown in FIG. 9 by application of the n-th RF excitation pulse, the transverse magnetization undergoes the phase shift of γ×M1×v due to the gradient magnetic field in the read out axis direction, immediately before the application of the (n+1)-th RF excitation pulse, as described above. As a result, the transverse magnetization of the flowing matter such as blood flow might not invert and the size of the transverse magnetization might change at each application of the RF excitation pulses.

That is, if a difference π+Δφ of phase angles of adjacent RF excitation pulses is set to an odd number times π, the size of the transverse magnetization of the flowing matter such as blood flow changes at each excitation and a steady state of the magnetization might not be maintained adequately. This leads to an emergence of an artifact such as ghost and blurring due to fluctuation of a signal intensity and to a change of the contrast itself.

Accordingly, this problem can be avoided by setting the difference π+Δφ between phase angles of adjacent RF excitation pulses to a value different from an odd number times π as shown in the expression (4-2). Especially, a steady state of the flowing matter such as blood flow can be maintained well by controlling the difference π+Δφ between phase angles of adjacent RF excitation pulses so that the condition shown in the expression (5) is satisfied.

$$\Delta\phi = \gamma \times M1 \times v \quad (5)$$

That is, a steady state of magnetization of flowing matter such as blood flow can be maintained more satisfactorily by setting a difference between phase angles of adjacent RF excitation pulses to a sum of π(180°) and a phase shift amount of magnetization in flowing matter such as blood flow. In other words, when Δφ shown in the expression (4-1) is set to a product of a first order moment M1 of gradient magnetic field in a readout axis direction within a TR, a velocity v of blood flow moving in the readout axis direction and a gyromagnetic ratio γ as shown by the expression (5), it becomes possible to hold a steady state of magnetization of flowing matter such as blood flow more satisfactorily. The reason will be described with reference to the drawings here.

Figure 10:
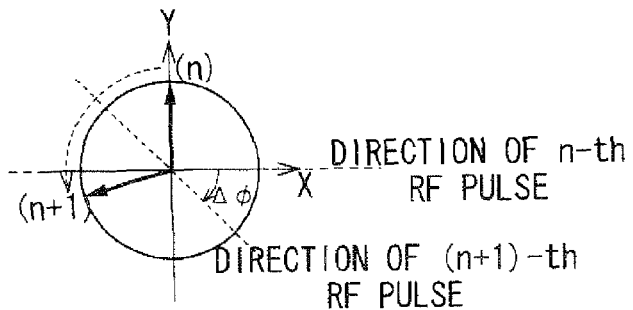
FIG. 10 is a diagram showing a variation of transverse magnetization in a static matter in case of setting a difference in phase angles between adjacent RF excitation pulses to a sum of $\pi$ and a phase shift amount of a flowing matter in the SSFP sequence shown in FIG. 7.
Figure 11:
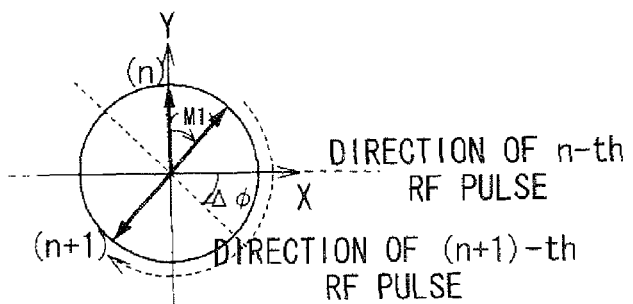
FIG. 11 is a diagram showing a variation of transverse magnetization in the flowing matter in case of setting a difference in phase angles between adjacent RF excitation pulses to a sum of $\pi$ and a phase shift amount of the flowing matter in the SSFP sequence shown in FIG. 7.

FIG. 10 is a diagram showing a variation of transverse magnetization in a static matter in case of setting a difference in phase angles between adjacent RF excitation pulses to a sum of π and a phase shift amount of a flowing matter in the SSFP sequence shown in FIG. 7. FIG. 11 is a diagram showing a variation of transverse magnetization in the flowing matter in case of setting a difference in phase angles between adjacent RF excitation pulses to a sum of π and a phase shift amount of the flowing matter in the SSFP sequence shown in FIG. 7.

Each of FIGS. 10 and 11 is a diagram showing a magnetization in XY directions in a system rotating, with regard to a laboratory system, with the same frequency as the center frequency of the magnetization, as viewed from the static magnetic field direction.

In the SSFP sequence shown in FIG. 7, if the difference π+Δφ between phase angles of adjacent RF excitation pulses is controlled so as to become a sum of a phase shift amount of flowing matter such as blood flow and π, namely, so that the expression (5) is satisfied, transverse magnetizations of a static matter such as an organ and flowing matter such as blood flow presents behaviors shown in FIG. 10 and FIG. 11, respectively.

Specifically, if a transverse magnetization of the static matter turns to the (n) position shown in FIG. 10 by application of the n-th RF excitation pulse, the transverse magnetization of the static matter changes to the (n+1) position by application of the (n+1)-th RF excitation pulse. Here, since the transmission phase angle φ(n+1) of the (n+1)-th RF excitation pulse differs from the transmission phase angle φ(n) of the n-th RF excitation pulse by π+Δφ, the transverse magnetization of the static matter does not invert by application of the (n+1)-th RF excitation pulse and the size of the transverse magnetization changes. For this reason, a steady state of the magnetization of the static matter is not maintained and signals from the static matters unnecessary for generating a blood flow image can be suppressed.

In contrast, if the transverse magnetization of the flowing matter such as blood flow moving with a constant velocity v in the read out axis direction turns to the (n) position shown in FIG. 11 by application of the n-th RF excitation pulse, the transverse magnetization undergoes a phase shift of γ×M1×v due to the gradient magnetic field in the read out axis direction immediately before the application of the (n+1)-th RF excitation pulse as described above. However, since the transmission phase angle φ(n+1) of the (n+1)-th RF excitation pulse differs from the transmission phase angle φ(n) of the n-th RF excitation pulse by π+Δφ, and also a shift amount Δφ of the transmission phase angle φ(n+1) is set to be equal to the phase shift amount γ×M1×v as shown in the expression (5), the transverse magnetization of the flowing matter such as blood flow inverts to the (n+1) position in FIG. 11 by application of the (n+1)-th RF excitation pulse. As a result, only transverse magnetization of the flowing matter such as blood flow can maintain a steady state well. Thus, only signals from blood flow necessary for generating a blood flow image can be selectively enhanced.

Note that, FIG. 8, FIG. 9, FIG. 10 and FIG. 11 show a change of transverse magnetization, but the same holds true for longitudinal magnetization. That is, by setting a difference between phase angles of adjacent RF excitation pulses to a sum of π(180°) and a phase shift amount of magnetization in a flowing matter such as blood flow, a size of longitudinal magnetization of the flowing matter becomes constant and a steady state can be maintained.

In this way, if each transmission phase angle φ of RF excitation pulses is controlled so that a phase shift amount γ×M1×v of a magnetization of a flowing matter becomes equal to a shift amount Δφ of a transmission phase angle φ of an RF excitation pulse, a steady state of the magnetization of the flowing matter can be maintained more satisfactorily.

Figure 12:
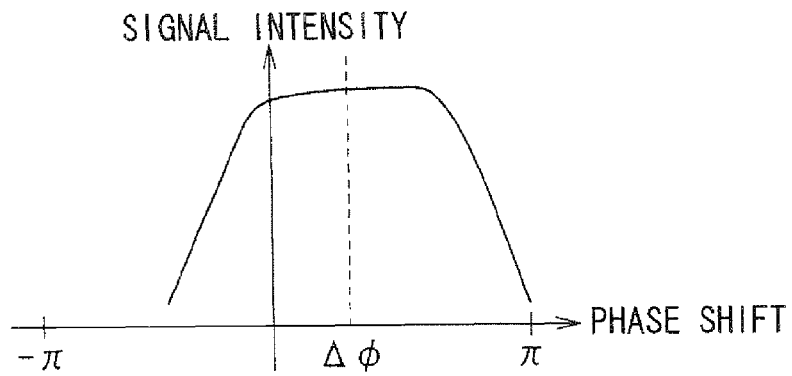
FIG. 12 is a diagram explaining a method for setting the shift amount $\Delta\phi$ of the transmission phase angle $\phi$ of an RF excitation pulse in the SSFP sequence shown in FIG. 7.

FIG. 12 is a diagram explaining a method for setting the shift amount Δφ of the transmission phase angle φ of an RF excitation pulse in the SSFP sequence shown in FIG. 7.

In FIG. 12, the abscissa axis denotes a phase shift amount γ×M1×v of magnetization of the flowing matter and the ordinate axis denotes an intensity of signal obtained from a phase-shifted matter.

As shown in FIG. 12, a magnetization of a flowing matter shifts in a phase direction by an amount depending on a flow velocity distribution due to gradient magnetic fields in a read-out axis direction. Consequently, signal intensities also have a distribution depending on the flow velocity distribution of the flowing matter. Therefore, it is only necessary to control a shift amount Δφ of a transmission phase angle φ of an RF excitation pulse so as to become equal to an average or typical phase shift amount γ×M1×v of the magnetization of the flowing matter.

Here, the phase shift amount γ×M1×v is proportional to a moving velocity v of the flowing matter in the readout axis direction and the first-order moment M1 of the gradient magnetic field in the readout axis direction. For this reason, it is necessary to obtain the moving velocity v of the flowing matter in the readout axis direction and determine the first-order moment M1 of the gradient magnetic field in the readout axis direction as an appropriate value.

Therefore, a preferable setting condition of the first-order moment M1 of the gradient magnetic field in the readout axis direction will be described first.

The relation of the expression (6) can be satisfied when the moving velocity v of the flowing matter in the readout axis direction is a typical value or when the first-order moment M1 is set to a large value.

$$\gamma \times M1 \times v > 2\pi \quad (6)$$

The expression (6) shows that the flowing matter moves not less than approximately 1 pixel during readout of signals. In such a case, intensities of obtained signals might decrease by controlling each transmission phase angle φ of RF excitation pulses so as to satisfy the only relation of the expression (5). Therefore, it is preferable to set the first-order moment M1 of the gradient magnetic field in the readout axis direction so as to satisfy the relation shown in the expression (7) using the maximum value vmax of the moving velocity v of the flowing matter in the readout axis direction as an index.

$$M1 < 2\pi\gamma vmax \quad (7)$$

Figure 13:
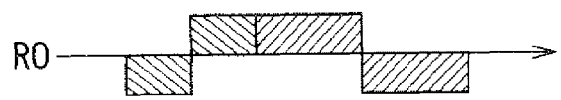
FIG. 13 is a diagram showing a practical example of gradient magnetic field in the readout axis direction set by the imaging condition setting unit shown in FIG. 6.
Figure 14:
FIG. 14 is a diagram showing another practical example of gradient magnetic field in the readout axis direction set by the imaging condition setting unit shown in FIG. 6.

FIG. 13 is a diagram showing a practical example of gradient magnetic field in the readout axis direction set by the imaging condition setting unit 40 shown in FIG. 6. FIG. 14 is a diagram showing another practical example of gradient magnetic field in the readout axis direction set by the imaging condition setting unit 40 shown in FIG. 6

For example, when the gradient magnetic field in the readout axis direction is set as shown in FIG. 13 and FIG. 14, the zero-order moment M0 in a TR becomes zero and the first-order moment M1 becomes a nonzero value. The difference between the gradient magnetic fields in the readout axis direction shown in FIG. 13 and FIG. 14 is that the signs of the first-order moments M1 mutually invert.

Note that, if the conditions for the SSFP sequence are satisfied, a gradient magnetic field in the readout axis direction can be set to an arbitrary waveform. For example, since a SSFP sequence is required to change the polarity of gradient magnetic field in the readout axis direction at least twice, the number of inversions of the polarity of gradient magnetic field in the readout axis direction can be increased.

In contrast, a moving velocity v of the flowing matter in the readout axis direction can be acquired in an arbitrary way in advance. For example, a known scan for measuring a moving velocity v of the flowing matter in the readout axis direction can be performed.

As an alternative, since a moving velocity v of the flowing matter might be considered approximately the same without depending on an object P so long as an imaging part is the same, it is possible to obtain a moving velocity v of the flowing matter with regard to each imaging part empirically in advance and compile a database. Note that, instead of associating a moving velocity v of the flowing matter with each imaging part, appropriate values of a shift amount Δφ of a transmission phase angle φ of an RF excitation pulse and/or a difference π+Δφ between phase angles of adjacent RF excitation pulses can be obtained in arbitrary means such as an imaging testing in advance and associated with an imaging part such as a head part, a breast part, an abdomen part and a lower limb part.

Moving velocities v of a flowing matter, shift amounts Δφ of transmission phase angles φ of RF excitation pulses and/or differences π+Δφ between phase angles of adjacent RF excitation pulses, associated with respective imaging parts of an object P in advance are stored in the imaging parameter storage unit 41.

Additionally, as another way, there is a method for obtaining an appropriate value of a moving velocity v of a flowing matter, a shift amount Δφ of a transmission phase angle φ of an RF excitation pulse or a difference π+Δφ between phase angles of adjacent RF excitation pulses by performing a pre-scan (preparation scan) for determining the appropriate value of the moving velocity v of the flowing matter, the shift amount Δφ of the transmission phase angle φ of the RF excitation pulse or the difference π+Δφ between the phase angles of the adjacent RF excitation pulses, precedently to an imaging scan for a blood flow image. The detail explanation thereof is described later.

Moreover, other preferable imaging conditions include the setting for acquisition timing of signals. Specifically, when the imaging condition is set so as to acquire signals at a timing at which a pumping velocity of blood flow becomes a maximum, a change of an intensity of a signal from flowing matter can be increased since a phase shift amount γ×M1×v also increases along with a moving velocity v of the flowing matter. This can improve contrast of the flowing matter compared to signals from a static matter.

When acquisition timings of signals are controlled, it is only necessary to perform a SSFP sequence in synchronization with an ECG or a pulse wave by using an ECG signal from the ECG unit 38 or a PPG signal from the PPG signal detection unit not shown in the figure.

So far a case of setting a single imaging condition by using a SSFP sequence for imaging a blood flow image was described, but setting mutually different plural imaging conditions for imaging a common blood flow image is also effective. Specifically, by setting mutually different plural imaging conditions and performing subtraction processing between plural pieces of image data acquired according to the respective imaging conditions, signals from static matters other than flowing matter such as blood flow can be canceled. This can acquire an image of the flowing matter such as blood flow with more satisfactory depiction ability by selectively using signals from the flowing matter such as blood flow.

Therefore, an image of flowing matter such as blood flow also can be generated by additionally setting an imaging condition without using SSFP, and by subtraction between plural images respectively obtained under an imaging condition with using SSFP as described above and an imaging condition without using SSFP.

Meanwhile, an image of flowing matter such as blood flow also can be generated by setting mutually different plural imaging conditions each using SSFP, and by subtraction between plural images respectively acquired according to respective imaging conditions. Here, examples of setting for plural imaging conditions by changing a data acquisition timing, by changing a first-order moment M1 of gradient magnetic field in a readout axis direction and by changing a shift amount Δφ of a transmission phase angle of an RF excitation pulse will be described.

Figure 15:
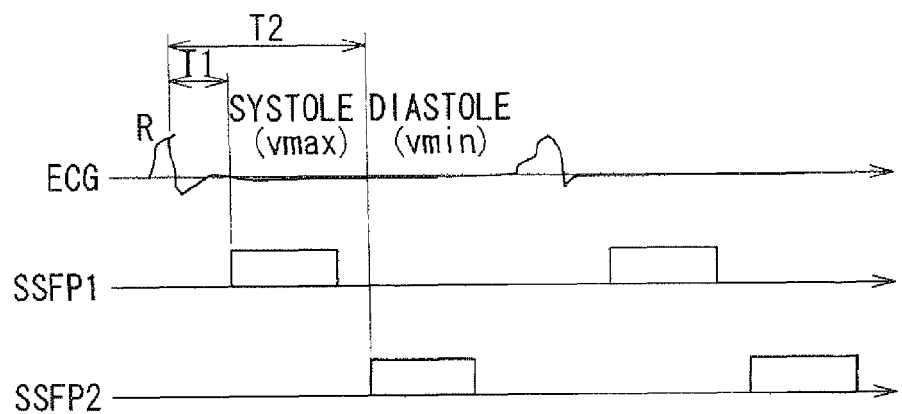
FIG. 15 is a diagram showing an example of setting plural imaging conditions with changing data acquisition timing by the imaging condition setting unit shown in FIG. 6.

FIG. 15 is a diagram showing an example of setting plural imaging conditions with changing data acquisition timing by the imaging condition setting unit 40 shown in FIG. 6.

As shown in FIG. 15, data acquisition timing can be controlled by applying an ECG gating or a peripheral gating. Specifically, for example, imaging conditions can be set by setting an R wave of an ECG signal to a trigger so that data acquisition is performed according to the first SSFP sequence (SSFP1) after a delay time T1 from the trigger and data acquisition is performed according to the second SSFP sequence (SSFP2) after a delay time T2, that is different from the delay time T1, from the trigger. Then, blood flow velocities v become mutually different values at the respective signal acquisition timings by the first SSFP sequence and the second SSFP sequence. Thus, signals from static matters can be canceled and a blood flow image can be depicted satisfactorily by subtraction processing between pieces of image data I1 and I2 respectively obtained by imaging twice under the first SSFP sequence and the second SSFP sequence.

In order to depict a satisfactory blood flow image, it is preferable to set the delay time T2 so that the data acquisition timing by the second SSFP sequence becomes a time phase, such as diastole, at which blood flow velocity v is slow and set the delay time T1 so that the data acquisition timing by the first SSFP sequence becomes a time phase, such as a systole, at which a blood flow velocity v is fast. Setting the delay times T1 and T2 like this can increase a difference value between signals from the blood flow.

This means a shift amount Δφ1 of a transmission phase angle of an RF excitation pulse in the first SSFP sequence and a shift amount Δφ2 of a transmission phase angle of an RF excitation pulse in the second SSFP sequence can be determined as the expressions (8-1) and (8-2), respectively, when a typical value of fast blood flow velocity is vmax and a typical value of slow blood flow velocity is vmin.

$$\Delta\phi1 = \gamma \times M1 \times v\text{max} \quad (8\text{-}1)$$

$$\Delta\phi2 = \gamma \times M1 \times v\text{min} \quad (8\text{-}2)$$

When the delay time T1 and the shift amount Δφ1 of the transmission phase angle of an RF excitation pulse of the first SSFP sequence, and the delay time T2 and the shift amount Δφ2 of the transmission phase angle of an RF excitation pulse of the second SSFP sequence are set as described above, a signal from the blood flow can be acquired with a signal intensity, smaller than that in a time phase in which the blood flow velocity v is fast, in a time phase in which the blood flow velocity v is slow while a signal from the blood flow can be acquired with a high signal intensity in a time phase in which the blood flow velocity v is fast. That is, signals can be respectively acquired with mutually different signal intensities from the blood flow by the first SSFP sequence and the second SSFP sequence of which delay times are mutually different.

Meanwhile, since magnetizations of static matters do not undergo the phase shift, signals are acquired from static matters at a constant signal intensity regardless of time phase. That is, by the first SSFP sequence and the second SSFP sequence, signals can be acquired from static matters with an equivalent signal intensity, respectively. Therefore, when subtraction processing is performed between two pieces of image data I1 and I2 based on signals acquired at mutually different two time phases, only signals from the blood flow are extracted while signals from static matters are canceled. Then, a blood flow image can be generated from only the extracted blood flow signals from the blood flow.

Then, an example of plural imaging conditions set by changing a first-order moment M1 of gradient magnetic field in a readout axis direction will be described.

By setting two SSFP sequences of the first SSFP sequence and the second SSFP sequence as respective imaging conditions by changing a first-order moment M1 of gradient magnetic field in a readout axis direction and performing subtraction between pieces of image data acquired in accordance with the respective imaging conditions as well, only signals from flowing matter such as blood flow can be extracted with canceling signals from static matters. That is, only signals from flowing matter such as blood flow can be extracted by subtraction between images respectively acquired by performing plural SSFP sequences in which first-order moments M1 of gradient magnetic field in a readout axis direction are mutually different.

For example, gradient magnetic fields in the readout axis direction having the waveforms shown in FIG. 13 and FIG. 14 can be set to be gradient magnetic fields of the first SSFP sequence and the second SSFP sequence respectively. Specifically, the gradient magnetic fields in the readout axis direction of the first SSFP sequence and the second SSFP sequence are determined so that the expression (9) is satisfied, wherein the first-order moment of the gradient magnetic field in the readout axis direction having the waveform shown in FIG. 13 is M1(A) and the first-order moment of the gradient magnetic field in the readout axis direction having the waveform shown in FIG. 14 is M1(B).

$$M1(A) = -M1(B) \quad (9)$$

Note that, the gradient magnetic field of the first SSFP sequence in the readout axis direction and the gradient magnetic field of the second SSFP sequence in the readout axis direction may be controlled so that the first-order moment M1(A) of the gradient magnetic field of the first SSFP sequence and the first-order moment M1(B) of the gradient magnetic field of the second SSFP sequence differ from each other merely.

When the gradient magnetic fields in the readout axis direction having the waveforms shown in FIG. 13 and FIG. 14 are set to be the gradient magnetic field of the first SSFP sequence and the gradient magnetic field of the second SSFP sequence, respectively, it is effective to equalize the shift amount $\Delta\phi 1$ of the transmission phase angle of an RF excitation pulse in the first SSFP sequence and the shift amount $\Delta\phi 2$ of the transmission phase angle of an RF excitation pulse in the second SSFP sequence.

Figure 16:
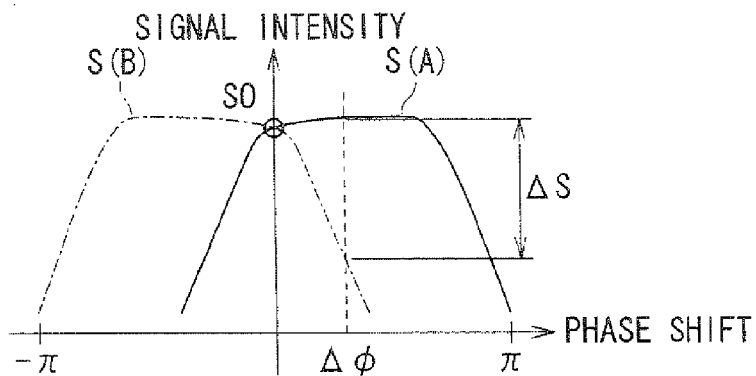
FIG. 16 is a diagram showing a condition of a magnetization phase shift in case of setting the first SSFP sequence and the second SSFP sequence, of which shift amounts $\Delta\phi$ of transmission phase angles are the same as each other and first order moments M1 of gradient magnetic fields have mutually inverse signs in the readout axis direction, as the imaging conditions by the imaging condition setting unit shown in FIG. 6.

FIG. 16 is a diagram showing a condition of a magnetization phase shift in case of setting the first SSFP sequence and the second SSFP sequence, of which shift amounts $\Delta\phi$ of transmission phase angles are the same as each other and first order moments M1 of gradient magnetic fields have mutually inverse signs in the readout axis direction, as the imaging conditions by the imaging condition setting unit 40 shown in FIG. 6.

In FIG. 16, the abscissa axis denotes a phase shift amount $\gamma \times M1 \times v$ of magnetization of the flowing matter such as blood flow and the ordinate axis denotes an intensity of signal obtained from a phase-shifted matter.

The signal intensity distributions obtained by performing the first SSFP sequence and the second SSFP sequence show flowing velocity dependences of flowing matter as shown in FIG. 16 respectively. That is, the signal intensities distribute depending on a velocity distribution of the flowing matter due to the phase shift of magnetization. This phase shift amount $\gamma \times M1 \times v$ is proportional to first-order moment M1 of the gradient magnetic field. Therefore, when the first SSFP sequence is performed, the signal intensity distribution S(A) in accordance with the first-order moment M1(A) of the gradient magnetic field of the first SSFP sequence is acquired. On the other hands, when the second SSFP sequence is performed, the signal intensity distribution S(B) becomes inversion of the signal intensity distribution S(A) generated by the first SSFP sequence since the first-order moment M1(B) of the gradient magnetic field of the second SSFP sequence is opposite in sign to the first-order moment M1(A) of the gradient magnetic field of the first SSFP sequence.

Here, the signal intensity when the phase shift amount $\gamma \times M1 \times v$ in FIG. 16 is zero corresponds to the signal intensity S0 from static matters. This signal intensity S0 from static matters is the same between a case where the first SSFP sequence is performed and a case where the second SSFP sequence is performed. Therefore, if the shift amount $\Delta\phi$ of the transmission phase angle of each of the first SSFP sequence and the second SSFP sequence is controlled so as to become equal to an average or typical phase shift amount $\gamma \times M1(A) \times v$ of magnetization of the flowing matter generated by the first SSFP sequence, only signals from the flowing matter can be extracted to generate a blood flow image while signals from static matters are canceled by subtraction processing between the first image data I(A) imaged by the first SSFP sequence and the second image data I(B) imaged by the second SSFP sequence. The blood flow image obtained in this way has signal intensities depending on the signal intensity difference $\Delta S$ corresponding to the shift amount $\Delta\phi$ of the transmission phase angle of each of the first SSFP sequence and the second SSFP sequence. This means signals from static matters can be canceled by subtraction processing while the signal intensity difference $\Delta S$ can be adequately obtained by a remarkably simplified control that the sign of the first-order moment M1 of the gradient magnetic field is inverted.

Note that, a blood flow velocity v in an object P varies by phase due to the influence of the heartbeat. For this reason, in order to obtain the inverted signal intensity distributions as shown in FIG. 16, it becomes important to equalize blood flow velocities v on performing the first SSFP sequence and the second SSFP sequence. Therefore, it is preferable to perform the first SSFP sequence and the second SSFP sequence with a same delay time using a same trigger in synchronization with an ECG or a pulse wave.

In addition, although two examples using the foregoing two types of SSFP sequences correspond to the examples for setting two SSFP sequences by changing a velocity v of flowing matter and a first-order moment M1 of gradient magnetic field in the expression (5) respectively, an image of flowing matter such as a blood flow image having suppressed signals from static matters can be also obtained with subtraction processing by setting two SSFP sequences by changing a shift amount $\Delta\phi$ itself of transmission phase angle since the phase shift amount $\gamma \times M1 \times v$ of magnetization of the flowing matter changes by performing the two SSFP sequences.

Then, other functions of the computer 32 will be described.

The sequence controller control unit 42 has a function for controlling the driving of the sequence controller 31 by giving an imaging condition including a SSFP sequence acquired from the imaging condition setting unit 40, to the sequence controller 31, in response to information instructing scan start from the input device 33. In addition, the sequence controller control unit 42 has a function for receiving raw data from the sequence controller 31 and arranging the raw data to k space formed in the k-space database 43. Therefore, the k-space database 43 stores the raw data generated by the receiver 30 as k space data. That is, k-space data is arranged in the k-space formed in the k-space database 43.

The image reconstruction unit 44 has a function for reconstructing image data, which is real space data, of an object P by capturing the k-space data from the k-space database 43 and performing image reconstruction processing including FT (Fourier transform) of the k-space data, and writing the obtained image data by reconstruction to the image database 44. Therefore, the image database 43 stores the image data reconstructed by the image reconstruction unit 44.

The blood flow image generating unit 46 has a function for generating blood flow image data for displaying by performing image processing such as subtraction processing and/or display processing such as MIP processing of necessary image data read form the image database 45 and displaying a blood flow image on the display unit 34 by supplying the generated blood flow image data to the display unit 34.

Then, the operation and action of a magnetic resonance imaging apparatus 20 will be described.

Figure 17:
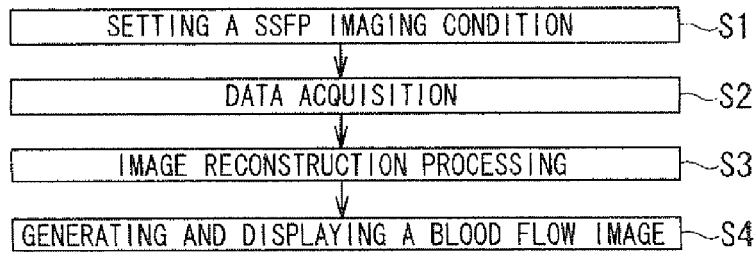
FIG. 17 is a flowchart showing a procedure for acquiring a blood flow image of an object by the magnetic resonance imaging apparatus shown in FIG. 5.

FIG. 17 is a flowchart showing a procedure for acquiring a blood flow image of an object P by the magnetic resonance imaging apparatus 20 shown in FIG. 5. The symbols including S with a number in FIG. 17 indicate each step of the flowchart.

Initially in the step S1, by the imaging condition setting unit 40, one of a single imaging condition using a SSFP sequence, plural imaging conditions using plural SSFP sequences having mutually different parameters, and plural imaging conditions using a SSFP sequence and using a sequence other than a SSFP sequences is set as an imaging condition or imaging conditions for imaging. Here, a case where two SSFP sequences having mutually different data acquisition timings in synchronization with an ECG are set as imaging conditions and a case where two SSFP sequences having mutually different first-order moments M1 of gradient magnetic field are set as imaging conditions will be described.

Setting of imaging conditions can be performed by only selecting an imaging protocol used for imaging from the prepared imaging protocols for associated parts and/or imaging conditions and inputting necessary parameters with the operation of the input device 33 with referencing a setting screen displayed on the display unit 34.

Therefore, when a user selects a SSFP sequence for a certain imaging part, a parameter such as a moving velocity v of blood flow, a shift amount $\Delta\phi$ of a transmission phase angle $\phi$ of an RF excitation pulse, or a difference $\pi+\Delta\phi$ between phase angles of adjacent RF excitation pulses, each associated with the corresponding imaging part is read from the imaging parameter storage unit 41 to the imaging condition setting unit 40. Further, delay times T1, T2 for an ECG-gated imaging and/or first-order moments M1(A), M1(B) of gradient magnetic field can be also determined in advance as imaging protocols for respective imaging parts. Alternatively, a user can set these various parameters as arbitrary values with the operation of the input device 33. A method for determining various parameters is as described above.

In addition, whether subtraction processing and/or MIP processing for generating a blood flow image is performed automatically or not can also be set through the setting screen. When the foregoing automatic image processing is set, blood flow image data can be generated and a blood flow image can be displayed without the operation of a user after the beginning of the imaging.

Subsequently, in step S2, data acquisition is performed according to the set imaging condition.

For this purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction for imaging start to the sequence controller control unit 42. The sequence controller control unit 42 supplies plural imaging conditions including a SSFP sequence received from the imaging condition setting unit 40 to the sequence controller 31. Therefore, the sequence controller 31 drives the gradient power supply 27, the transmitter 29, and the receiver 30 in accordance with the imaging conditions received from the sequence controller control unit 42, thereby generating a gradient magnetic field in the imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 42. The sequence controller control unit 42 arranges the raw data as k-space data to the k space formed in the k-space database 43.

Note that, two sets of K space data respectively corresponding to mutually different delay times T1, T2 or mutually different first-order moments M14(A), M1(B) of gradient magnetic field are stored in the K-space database 43. Further, data is acquired in synchronization with an ECG by using an ECG signal obtained in the ECG unit 38, for example, in case of performing data acquisition with the mutually different delay times T1, T2.

Subsequently, in step S3, image reconstruction is performed by the image reconstruction unit 44. Specifically, the image reconstruction unit 44 reads the k-space data from the k-space database 43 and performs image reconstruction processing of the read k-space data, thereby reconstructing image data. The obtained image data is written in the image database 45. Similarly to K-space data, two sets of image data I1, I2 corresponding to the mutually different delay times T1, T2 or two sets of image data I(A), I(B) corresponding to the mutually different first-order moments M1(A), M1(B) of gradient magnetic fields are stored in the image database 45.

Subsequently, in step S4, blood flow image data is generated by the blood flow image generating unit 46 and a blood flow image is displayed on the display unit 34. Specifically, the blood flow image generating unit 46 reads the two sets of image data I1, I2 corresponding to the mutually different delay times T1, T2 or the two sets of image data I(A), I(B) corresponding to the mutually different first-order moments M1(A), M1(B) of gradient magnetic fields from the image database 45 and performs subtraction processing, thereby generating 3D (three dimensional) blood flow image data. Further, the blood flow image generating unit 46 performs MIP processing of the 3D blood flow image data for displaying the 3D blood flow image data on the display unit 34, thereby generating 2D (two-dimensional) blood flow image data. The generated 2D blood flow image data is supplied to the display unit 34. Consequently, a blood flow image is displayed an the display unit 34.

Figure 18:
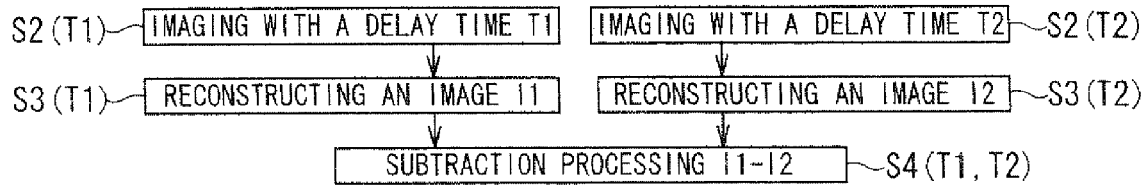
FIG. 18 is a flowchart showing a detail procedure from data acquisition to generation of a blood flow image in case of data acquisition by two SSFP sequence with mutually different delay times T1, T2 in the magnetic resonance imaging apparatus shown in FIG. 5.

FIG. 18 is a flowchart showing a detail procedure from data acquisition to generation of a blood flow image in case of data acquisition by two SSFP sequence with mutually different delay times T1, T2 in the magnetic resonance imaging apparatus 20 shown in FIG. 5. Note that, each step number in FIG. 18 corresponds to that in FIG. 17.

As shown in FIG. 18, in step S2(T1), data acquisition is performed with the delay time T1 from an R wave serving as a trigger in synchronized with an ECG according to the first SSFP sequence. On the other hands, in step S2(T2), data acquisition is performed with the delay time T2 from an R wave serving as a trigger in synchronized with an ECG according to the second SSFP sequence.

Subsequently, in step S3(T1), image data I1 is reconstructed by image reconstruction processing based on date acquired with the delay time T1 by the image reconstruction unit 44. On the other hands, in step S3(T2), image data I2 is reconstructed by image reconstruction processing based on data acquired with the delay time T2 by the image reconstruction unit 44.

Subsequently, in step S4 (T1, T2), subtraction processing between the image data I1 and the image data I2 is performed by the blood flow image generating unit 46. A result |I1-I2| of subtraction processing is depicted as blood flow image data. Then, blood flow image data subjected to MIP processing is displayed as mentioned above.

Figure 19:
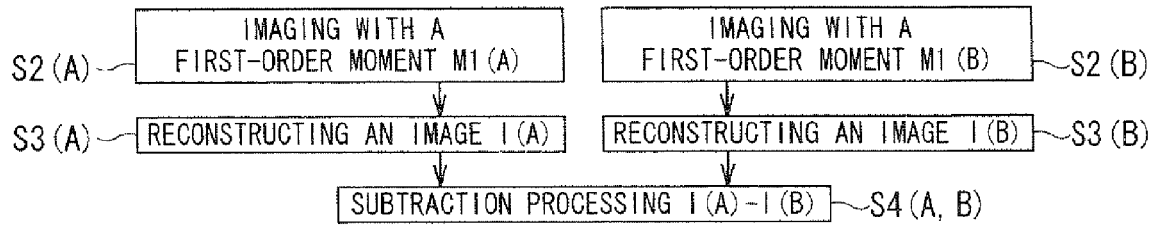
FIG. 19 is a flowchart showing a detail procedure from data acquisition to generation of a blood flow image in case of data acquisition by two SSFP sequence with mutually different first order moments M1(A), M1(B) of gradient magnetic fields in the magnetic resonance imaging apparatus shown in FIG. 5.

FIG. 19 is a flowchart showing a detail procedure from data acquisition to generation of a blood flow image in case of data acquisition by two SSFP sequence with mutually different first order moments M1(A), M1(B) of gradient magnetic fields in the magnetic resonance imaging apparatus 20 shown in FIG. 5. Note that, each step number in FIG. 19 corresponds to that in FIG. 17.

As shown in FIG. 19, in step S2(A), data acquisition is performed according to the first SSFP sequence of which first order moment of gradient magnetic field is set to M1(A). On the other hands, in step S2(B), data acquisition is performed according to the second SSFP sequence of which first order moment of gradient magnetic field is set to M1(B).

Subsequently, in step S3(A), image data I(A) is reconstructed by image reconstruction processing based on data acquired with setting the first order moment of gradient magnetic field to M1(A) by the image reconstruction unit 44. On the other hands, in step S3(B), image data I(B) is reconstructed by image reconstruction processing based on data acquired with setting the first order moment of gradient magnetic field to M1(B) by the image reconstruction unit 44.

Subsequently, in step S4(A, B), subtraction processing between the image data I(A) and the image data I(B) is performed by the blood flow image generating unit 46. A result |I(A)-I(B)| of subtraction processing is depicted as blood flow image data. Then, blood flow image data subjected to MIP processing is displayed as mentioned above.

In this way, signals from static matters can be suppressed and only an image of flowing matter such as blood flow can be selectively obtained by imaging conditions each using a SSFP sequence.

Subsequently, a method for obtaining a parameter, such as a moving velocity v of flowing matter, a shift amount $\Delta\phi$ of a transmission phase angle $\phi$ of a RF excitation pulse or a difference $\pi+\Delta\phi$ of phase angles of adjacent RF excitation pulses, by a pre-scan (preparation scan), when an appropriate value of the parameter is unknown at the time of setting of imaging conditions, will be described. Here, a method for performing a preparation scan for obtaining a shift amount $\Delta\phi$ of a transmission phase angle $\phi$ of an RF excitation pulse will be described but the same holds true in case of obtaining another parameter.

Figure 20:
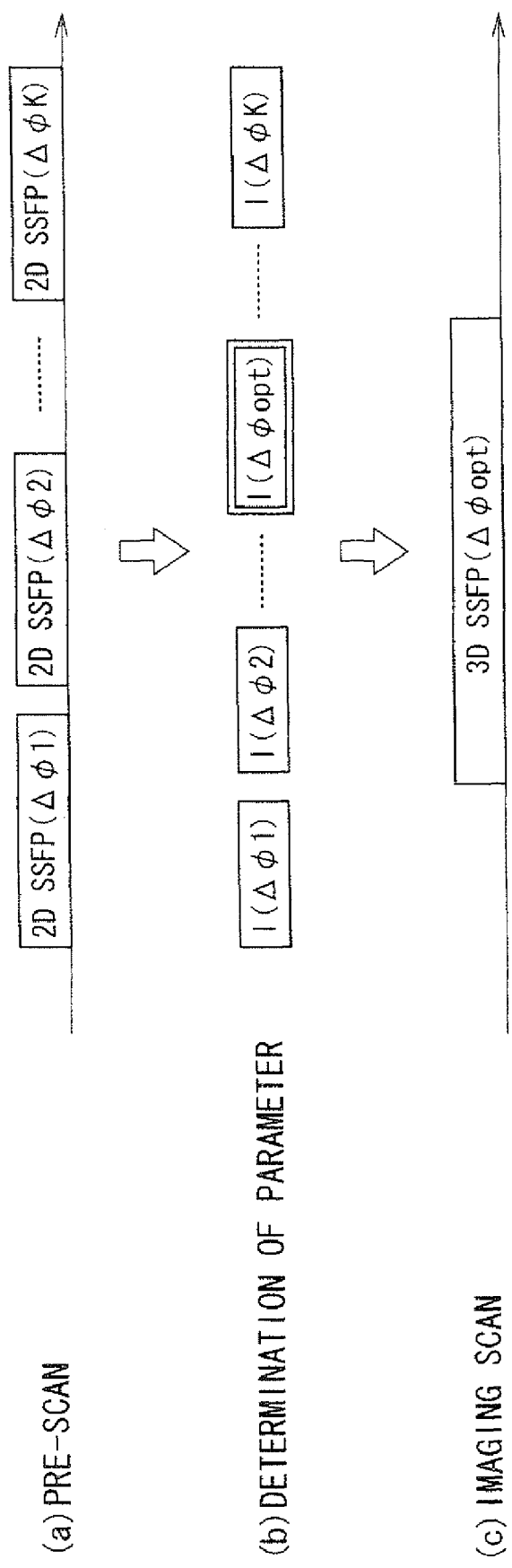
FIG. 20 is a diagram showing a procedure for performing an imaging scan by using a parameter determined through a pre-scan by the magnetic resonance imaging apparatus shown in FIG. 5.

FIG. 20 is a diagram showing a procedure for performing an imaging scan by using a parameter determined through a pre-scan by the magnetic resonance imaging apparatus 20 shown in FIG. 5.

Firstly, a preparation scan is performed as shown in FIG. 20(a). For that purpose, K values $\Delta\phi1$, $\Delta\phi2$, $\Delta\phi3$, ..., $\Delta\phi K$ derived by varying a shift amount $\Delta\phi$ of transmission phase angle $\phi$ of an RF excitation pulse gradually are determined in advance. Then, SSFP sequences where these values $\Delta\phi1$, $\Delta\phi2$, $\Delta\phi3$, ..., $\Delta\phi K$ are set respectively are sequentially performed as a preparation scan.

Here, since a preparation scan is not a scan for generating a blood flow image, but a scan for obtaining a shift amount $\Delta\phi$ of a transmission phase angle $\phi$ of an RF excitation pulse that is a parameter, it is only necessary to acquire at least data necessary for determining the parameter. Therefore, from the viewpoints of shortening of data acquisition time, simplification of imaging processing and miniaturization of data size, a 2D imaging is preferable for the preparation scan. In addition, it is preferable to match pieces of imaging condition except for a shift amount $\Delta\phi$ of a transmission phase angle $\phi$ of an RF excitation pulse with those for an imaging scan for generating a blood flow image.

When a preparation scan is performed and pieces of blood flow image data is generated from pieces of data acquired in accordance with the respective shift amounts $\Delta\phi1$, $\Delta\phi2$, $\Delta\phi3$, ..., $\Delta\phi K$ of a transmission phase angle $\phi$ of a RF excitation pulse, pieces of blood flow image data $I(\Delta\phi1)$, $I(\Delta\phi2)$, $I(\Delta\phi3)$, ..., $I(\Delta\phi K)$ corresponding to the respective shift amounts $\Delta\phi1$, $\Delta\phi2$, $\Delta\phi3$, ..., $\Delta\phi K$ of a transmission phase angle $\phi$ of a RF excitation pulse can be obtained as pieces of pre-scan image data as shown in FIG. 20(b). A user can determine the optimum shift amount $\Delta\phi$opt of a transmission phase angle $\phi$ of a RF excitation pulse by displaying these pieces of blood flow image data $I(\Delta\phi1)$, $I(\Delta\phi2)$, $I(\Delta\phi3)$, ..., $(\Delta\phi K)$ and selecting a piece of blood flow image data $I(\Delta\phi$opt$)$ with the most satisfactory contrast by sight.

In this case, selection information of the piece of blood flow image data $I(\Delta\phi$opt$)$ from the input device 33 is provided to the image condition setting unit 40 and the shift amount $\Delta\phi$opt of a transmission phase angle $\phi$ of an RF excitation pulse associated with the selected piece of blood flow image data $I(\Delta\phi$opt$)$ is set as a shift amount $\Delta\phi$ of a transmission phase angle $\phi$ of an RF excitation pulse for an imaging scan in the image condition setting unit 40.

Note that, the image condition setting unit 40 may be configured to automatically select a piece of blood flow image data $I(\Delta\phi$opt$)$ with the most satisfactory contrast from plural pieces of blood flow image data $I(\Delta\phi1)$, $I(\Delta\phi2)$, $I(\Delta\phi3)$, ..., $I(\Delta\phi K)$ by imaging processing such as threshold processing.

Subsequently, as shown in FIG. 20(c), an imaging scan for imaging a blood flow image is performed as described above by a 3D SSFP sequence having the set optimum shift amount $\Delta\phi$opt of a transmission phase angle $\phi$ of a RF excitation pulse.

Consequently, even if the object P is different, an imaging scan can be performed using a shift amount $\Delta\phi$, of a transmission phase angle $\phi$ of an RF excitation pulse, more appropriate for an object P and/or an imaging part. This allows the display of a blood flow image with a more satisfactory depicting ability.

That is, the foregoing magnetic resonance imaging apparatus 20 is an apparatus configured to be able to image only flowing matter such as blood flow selectively by imaging with using a SSFP sequence set so that a first-order moment of gradient magnetic field at least one of a slice axis direction and a readout axis direction becomes a nonzero value.

Consequently, according to the magnetic resonance imaging apparatus 20, a MR image of only flowing matter can be acquired with an improved SNR by using SSFP.

Especially, signals from flowing matter can be selectively and more satisfactorily extracted for imaging by setting a difference between transmission phase angles of adjacent RF excitation pulses to a value different from a product of an odd number and $\pi(180°)$ and/or by subtraction between pieces of image data obtained by plural imaging conditions having mutually different conditions such as delay times for imaging with synchronization and/or first-order moments of gradient magnetic field.

What is claimed is:

1. A magnetic resonance imaging apparatus comprising:
   a data acquisition unit configured to acquire magnetic resonance data according to an imaging condition for obtaining a steady state free precession of nuclear magnetic spins in flowing matter in an object by applying plural excitation pulses having a same flip angle with a constant repetition time and gradient magnetic fields to the object; and an image generating unit configured to generate an image of the flowing matter based on the magnetic resonance data, wherein respective zero order moments of: (a) gradient magnetic field within the repetition time, (b) a gradient magnetic field pulse for slice selection from each application time of the plural excitation pulses until a center time of a corresponding echo, (c) a gradient magnetic field pulse for readout from each application time of the plural excitation pulses until the center time of a corresponding echo, (d) the gradient magnetic field pulse for slice selection from the center time of each echo until an application time of a following excitation pulse, and (e) the gradient magnetic field for readout from a center time of each echo until an application time of a following excitation pulse are all zero, while a first order moment of the gradient magnetic field pulse for readout within the repetition time is nonzero by having an asymmetric pulse shape about the center of the pulse shape on the time axis.

2. A magnetic resonance imaging apparatus of claim 1, wherein said data acquisition unit is configured to acquire the magnetic resonance data with setting a difference in transmission phases between adjacent excitation pulses to a value different from an odd number times 180 degrees.

3. A magnetic resonance imaging apparatus of claim 1, wherein said data acquisition unit is configured to acquire the magnetic resonance data with setting a difference in transmission phases between adjacent excitation pulses to a sum of a phase shift amount of magnetization of the flowing matter and 180 degrees.

4. A magnetic resonance imaging apparatus of claim 1, wherein said data acquisition unit is configured to acquire the magnetic resonance data according to an imaging condition without using the steady state free precession in addition to the imaging condition for obtaining the steady state free precession, and said image generating unit is configured to generate the image of the flowing matter by subtracting plural images respectively obtained by the imaging condition for obtaining the steady state free precession and the imaging condition without using the steady state free precession.

5. A magnetic resonance imaging apparatus of claim 1, wherein said data acquisition unit is configured to acquire the magnetic resonance data with mutually different delay times with regard to a trigger set on an electrocardiogram or a pulse wave, and said image generating unit is configured to generate the image of the flowing matter by subtracting plural images respectively obtained based on the magnetic resonance data with the delay times.

6. A magnetic resonance imaging apparatus of claim 1, wherein said data acquisition unit is configured to acquire the magnetic resonance data according to plural imaging conditions in which respective first order moments of at least one of gradient magnetic fields for slice selection and gradient magnetic fields for readout within the repetition time are mutually different, and said image generating unit is configured to generate the image of the flowing matter by subtracting plural images respectively obtained by the plural imaging conditions.

7. A magnetic resonance imaging apparatus of claim 1, wherein said data acquisition unit is configured to acquire the magnetic resonance data according to plural imaging conditions in which respective differences in transmission phases between adjacent excitation pulses are mutually different, and said image generating unit is configured to generate the image of the flowing matter by subtracting plural images respectively obtained by the plural imaging conditions.

8. A magnetic resonance imaging apparatus of claim 1, further comprising:

a storage unit configured to store a difference in transmission phases between adjacent excitation pulses with relating the difference with an imaging portion, wherein said data acquisition unit is configured to acquire a difference in transmission phases between adjacent excitation pulses, corresponding to a designated imaging portion, from said storage unit, for the imaging condition to acquire the magnetic resonance data.

9. A magnetic resonance imaging apparatus of claim 1, further comprising:

a pre-scan unit configured to perform a pre-scan with changing a difference in transmission pulses between adjacent excitation pulses of the imaging condition; and a phase difference determining unit configured to determine the difference in the transmission pulses between the adjacent excitation pulses used for the imaging condition based on plural pre-scan images generated by the pre-scan, wherein said data acquisition unit is configured to acquire the magnetic resonance data according to the imaging condition including the determined difference in the transmission pulses between the adjacent excitation pulses.

10. A magnetic resonance imaging apparatus of claim 1, wherein said data acquisition unit is configured to acquire the magnetic resonance data with setting a difference in transmission pulses between adjacent excitation pulses to a sum of 180 degrees and a value derived by multiplying a first order moment of the gradient magnetic field for readout within the repetition time by a velocity of the flowing matter in a readout axis direction and a gyromagnetic ratio.

11. A magnetic resonance imaging apparatus comprising:

a pre-scan configured to acquire pieces of magnetic resonance data corresponding to mutually different plural differences in transmission phases between adjacent excitation pulses by performing a pre-scan with changing a difference in the transmission phases between the adjacent excitation pulses of an imaging condition for obtaining a steady state free precession of nuclear magnetic spins in flowing matter in an object by applying plural excitation pulses having a same flip angle with a constant repetition time and gradient magnetic fields to the object; and an image generating unit configured to generate plural pre-scan images of the flowing matter based or the pieces of the magnetic resonance data, wherein respective zero order moments of (a) gradient magnetic field within the repetition time, (b) a gradient magnetic field pulse for slice selection from each application time of the plural excitation pulses until a center time of a corresponding echo, (c) a gradient magnetic field pulse for readout from each application time of the plural excitation pulses until the center time of a corresponding echo, (d) the gradient magnetic field pulse for slice selection from the center time of each echo until an application time of a following excitation pulse, and (e) the gradient magnetic field pulse for readout from a center time of each echo until an application time of a following excitation pulse are all zero, while a first order moment of the gradient magnetic field pulse for readout within the repetition time is nonzero by having an asymmetric pulse shape about the center of the pulse shape on the time axis.

12. A magnetic resonance imaging method comprising:
acquiring magnetic resonance data according to an imaging condition for obtaining a steady state free precession of nuclear magnetic spins in flowing matter in an object by applying plural excitation pulses having a same flip angle with a constant repetition time and gradient magnetic fields to the object and
generating an image of the flowing matter based on the magnetic resonance data,
wherein respective zero order moments of (a) gradient magnetic field within the repetition time, (b) a gradient magnetic field pulse for slice selection from each application time of the plural excitation pulses until a center time of a corresponding echo, (c) a gradient magnetic field pulse for readout from each application time of the plural excitation pulses until the center time of a corresponding echo, (d) the gradient magnetic field pulse for slice selection from the center time of each echo until an application time of a following excitation pulse, and (e) the gradient magnetic field pulse for readout from a center time of each echo until an application time of a following excitation pulse are all zero, while a first order moment of the gradient magnetic field pulse for readout within the repetition time is nonzero by having an asymmetric pulse shape about the center of the pulse shape on the time axis.

13. A magnetic resonance imaging method of claim 12, wherein the magnetic resonance data is acquired with setting a difference in transmission phases between adjacent excitation pulses to a value different from an odd number times 180 degrees.

14. A magnetic resonance imaging method of claim 12, wherein the magnetic resonance data is acquired with setting a difference in transmission phases between adjacent excitation pulses to a sum of a phase shift amount of magnetization of the flowing matter and 180 degrees.

15. A magnetic resonance imaging method of claim 12, wherein the magnetic resonance data is acquired according to an imaging condition without using the steady state free precession in addition to the imaging condition for obtaining the steady state free precession, and
the image of the flowing matter is generated by subtracting plural images respectively obtained by the imaging condition for obtaining the steady state free precession and the imaging condition without using the steady state free precession.

16. A magnetic resonance imaging method of claim 12, wherein the magnetic resonance data is acquired with mutually different delay times with regard to a trigger set on an electrocardiogram or a pulse wave, and
the image of the flowing matter is generated by subtracting plural images respectively obtained based on the magnetic resonance data with the delay times.

17. A magnetic resonance imaging method of claim 12, wherein the magnetic resonance data is acquired according to plural imaging conditions in which respective first order moments of at least one of gradient magnetic fields for slice selection and gradient magnetic fields for readout within the repetition time are mutually different, and
the image of the flowing matter is generated by subtracting plural images respectively obtained by the plural imaging conditions.

18. A magnetic resonance imaging method of claim 12, wherein the magnetic resonance data is acquired according to plural imaging conditions in which respective differences in transmission phases between adjacent excitation pulses are mutually different, and
the image of the flowing matter is generated by subtracting plural images respectively obtained by the plural imaging conditions.

19. A magnetic resonance imaging method of claim 12, further comprising:
storing a difference in transmission phases between adjacent excitation pulses with relating the difference with an imaging portion; and
acquiring a difference in transmission phases between adjacent excitation pulses, corresponding to a designated imaging portion, from stored differences in transmission phases,
wherein the magnetic resonance data is acquired according to the imaging condition including the acquired difference in the transmission phases between the adjacent excitation pulses.

20. A magnetic resonance imaging method of claim 12, further comprising:
performing a pre-scan with changing a difference in transmission pulses between adjacent excitation pulses of the imaging condition; and
determining the difference in the transmission pulses between the adjacent excitation pulses used for the imaging condition based on plural pre-scan images generated by the pre-scan,
wherein the magnetic resonance data is acquired according to the imaging condition including the determined difference in the transmission pulses between the adjacent excitation pulses.

21. A magnetic resonance imaging method of claim 12, wherein the magnetic resonance data is acquired with setting a difference in transmission pulses between adjacent excitation pulses to a sum of 180 degrees and a value derived by multiplying a first order moment of the gradient magnetic field for readout within the repetition time by a velocity of the flowing matter in a readout axis direction and a gyromagnetic ratio.

* * * * *